(12) United States Patent
Mukai

(10) Patent No.: US 6,310,818 B1
(45) Date of Patent: Oct. 30, 2001

(54) SEMICONDUCTOR MEMORY DEVICE AND METHOD OF CHANGING OUTPUT DATA OF THE SAME

(75) Inventor: Masamichi Mukai, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/817,221

(22) Filed: Mar. 27, 2001

(30) Foreign Application Priority Data

Nov. 6, 2000 (JP) .................................................. 12-337460

(51) Int. Cl.$^7$ ........................................................ G11C 7/00

(52) U.S. Cl. ................................ 365/230.05; 365/189.05; 365/230.08

(58) Field of Search ........................ 365/189.05, 189.18, 365/230.05, 230.08

(56) References Cited

U.S. PATENT DOCUMENTS 5,787,457 * 7/1998 Milla et al. ..................... 365/230.05

* cited by examiner

Primary Examiner—Terrell W. Fears
(74) Attorney, Agent, or Firm—Arent Fox Kintner Plotkin & Kahn, PLLC

(57) ABSTRACT

The present invention provides a method for changing output data of a multiple-port semiconductor memory device, including memory cells, first and second bit lines connected to the memory cells, a first port connected to the first bit line to write data to the memory cells, a second port connected to the second bit line to output data stored in the memory cells, and a data read circuit connected to the second bit line and having a latch circuit for holding the data of one of the memory cells. The method of the present invention detects a change in the stored data in the memory cell associated with the data held by the latch circuit based on a potential at the second bit line, and changes the data held by the latch circuit when a change in the stored data is detected.

16 Claims, 10 Drawing Sheets

Fig.10
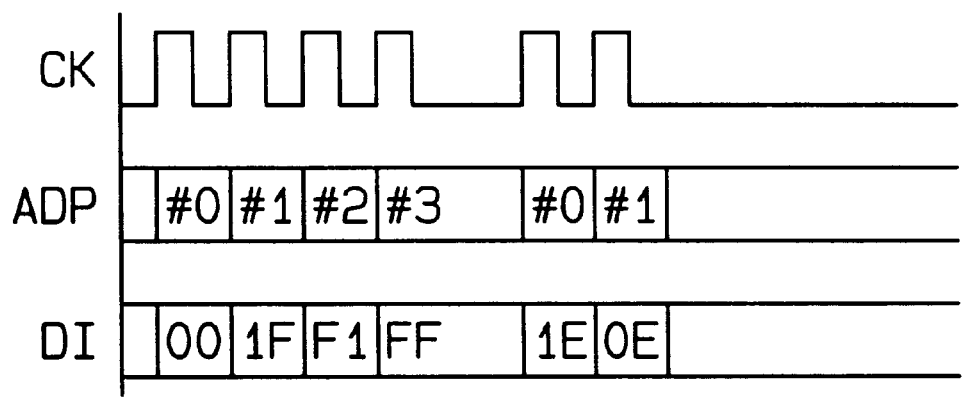
<Port W>
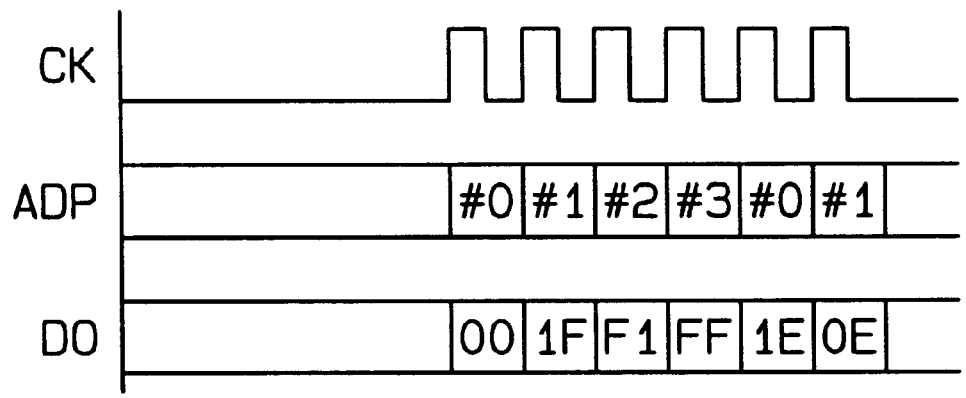
<Port R>

SEMICONDUCTOR MEMORY DEVICE AND METHOD OF CHANGING OUTPUT DATA OF THE SAME

BACKGROUND OF THE INVENTION

The present invention relates to a semiconductor memory device, and more particularly, to a semiconductor memory device having multiple ports.

A multiport memory and a delay line constitute a semiconductor memory device that has multiple ports. A multiport memory includes a plurality of address and input/output (I/O) circuits, and is used to transfer messages between processors. A delay line includes a data input circuit and a data output circuit, and is used to process images.

In some of the multiple-port semiconductor memory devices, when write data is provided to a memory cell from one of the ports, the write data is used to change read data, which has been read from the memory cell by a read circuit.

FIG. 1 is a schematic block diagram of a prior art multiport memory 10. The multiport memory 10 includes a memory cell array 11, a data write circuit 13, a data read circuit 14, an address comparison circuit 15, a write detection circuit 16, a data changing circuit 17, port A and port B (not shown). The memory cell array 11 includes memory cells 12, which are arranged in a matrix-like manner. The multiport memory 10 writes data (write data) WD that is input through the port A to the memory cells 12, and outputs data (read data) RD that is read from the memory cells 12 via the port B.

The data write circuit 13 drives a pair of first bit lines BLA, XBLA based on the write data WD. A row decoder (not shown) drives first word lines WLA. The memory cells 12 are each connected to one of the first word lines WLA and stores data (memory information) based on the potential at the pair of first bit lines BLA, XBLA. Further, the row decoder drives second word lines WLB to read the information stored in the memory cells 12 into a pair of second bit lines BLB, XBLB.

The data read circuit 14 includes a sense amplifier and a latch circuit. The sense amplifier amplifies the potential difference between the second bit lines BLB, XBLB and generates amplified data. The potential difference is generated in correspondence with the information stored in the memory cells 12. The latch circuit latches the amplified data and generates a single bit of read data, and subsequently outputs the read data RD to an external device. The sense amplifier ceases functioning when the latch circuit latches the amplified data.

The address comparison circuit 15, the write detection circuit 16, and the data changing circuit 17 changes read data RD that is read into the port B with write data WD that is newly written to the memory cells 12 via the port A. The write data WD is stored at the same address as the read data RD.

The address comparison circuit 15 compares a write address with a read address to generate a comparison signal S1 and provide the comparison signal S1 to the data changing circuit 17. The write detection circuit 16 detects whether data is written to other ports (e.g., the port A in FIG. 1), generates a detection signal S2 and provides the detection signal S2 to the data changing circuit 17.

The data changing circuit 17 generates an activation signal S3 based on the comparison and detection signals S1, S2. The data changing circuit 17 generates the activation signal S3 when the write address and the read address are the same and data is written to port A. The sense amplifier of the data read circuit 14 is activated based on the activation signal S3.

When the write address and the read address are the same, the first and second word lines WLA, WLB connected to the memory cell 12 (into which the write data WD is to be written) are both activated. Accordingly, the potential difference generated between the second bit lines BLB, XBLB is equal to the potential difference between the first bit lines BLA, XBLA, or the potential difference corresponding to the write data WD. In this state, the sense amplifier amplifies the potential difference between the second bit lines BLB, XBLB. Accordingly, the latch circuit latches a signal having the same value as the write data WD to generate the read data RD.

It is increasingly desirable for semiconductor memory devices to have higher integration capabilities and higher operating speeds. If the number of ports is increased in order to operate a multiport memory at a higher speed, the number of the address comparison circuit 15, the write detection circuit 16, and the data changing circuit 17 will increase accordingly. An increase in the number of the circuits 15, 16, 17 results in an increase in the chip area and thereby hinders the integration capability of the semiconductor memory device.

SUMMARY OF THE INVENTION

It is an object of the present invention to provide a multiple-port semiconductor memory device that enables higher integration and a method for changing output data in such a semiconductor memory device.

To achieve the above object, the present invention provides a method for changing output data of a semiconductor memory device having a plurality of ports. The semiconductor memory device includes a plurality of memory cells, a first bit line connected to the memory cells, a second bit line connected to the memory cells, a first port connected to the first bit line for writing input data to the memory cells via the first bit line, a second port connected to the second bit line for outputting data stored in the memory cells via the second bit line, and a data read circuit connected to the second bit line and having a latch circuit for holding the data of one of the memory cells. The method includes detecting a change in the stored data of the memory cell based on a potential at the second bit line, and changing the data held at the latch circuit when a change in the stored data is detected.

The present invention further provides a semiconductor memory device including a plurality of memory cells, a first word line connected to the memory cells, a second word line connected to the memory cells, a first bit line connected to the memory cells, and a second bit line connected to the memory cells. A first port is connected to the first word line and the first bit line for writing input data into the memory cells via the first bit line by activating the first word line. A second port is connected to the second word line and the second bit line for outputting data stored in each of the memory cells via the second bit line by activating the second word line. The second port includes a data read circuit connected to the second bit line for receiving the stored data and generating output data from the stored data. A data holding circuit is connected to the data read circuit for holding the output data and generating holding data. A data change detection circuit is connected to the second bit line for detecting whether the stored data has changed based on a potential at the second bit line. A data changing circuit is connected to the data change detection circuit and the data holding circuit for changing the output data using the holding data.

The present invention further provides a delay line including a plurality of memory cells, a first word line connected to the memory cells, a second word line connected to the memory cells, a first bit line connected to the memory cells, and a second bit line connected to the memory cells. A first port is connected to the first word line and the first bit line for writing input data to the memory cells via the first bit line by activating the first word line. A second port is connected to the second word line and the second bit line for outputting data stored in each of the memory cells via the second bit line by activating the second word line. The second port includes a data read circuit connected to the second bit line for receiving the stored data and generating output data from the stored data. A data holding circuit is connected to the data read circuit for holding the output data and generating holding data. A data change detection circuit is connected to the second bit line for detecting whether the stored data has changed based on a potential at the second bit line. A data changing circuit is connected to the data change detection circuit and the data holding circuit for changing the output data using the holding data.

The present invention further provides a multiport memory including a plurality of memory cells, a first word line connected to the memory cells, a second word line connected to the memory cells, a first bit line connected to the memory cells, and a second bit line connected to the memory cells. A first port is connected to the first word line and the first bit line for writing input data to the memory cells via the first bit line by activating the first word line. A second port is connected to the second word line and the second bit line for outputting data stored in each of the memory cells via the second bit line by activating the second word line. The second port includes a data read circuit connected to the second bit line for receiving the stored data and generating output data from the stored data. A data holding circuit is connected to the data read circuit for holding the output data and generating holding data. A data change detection circuit is connected to the second bit line for detecting whether the stored data has changed based on a potential at the second bit line. A data changing circuit is connected to the data change detection circuit and the data holding circuit for changing the output data using the holding data.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the description of the following embodiments together with the accompanying drawings in which:

FIG. 10 is a combined timing and waveform chart illustrating the operation of the semiconductor memory device of FIG. 9.

DETAILED DESCRIPTION OF THE PREFERRED EMBODIMENTS

Figure 1:
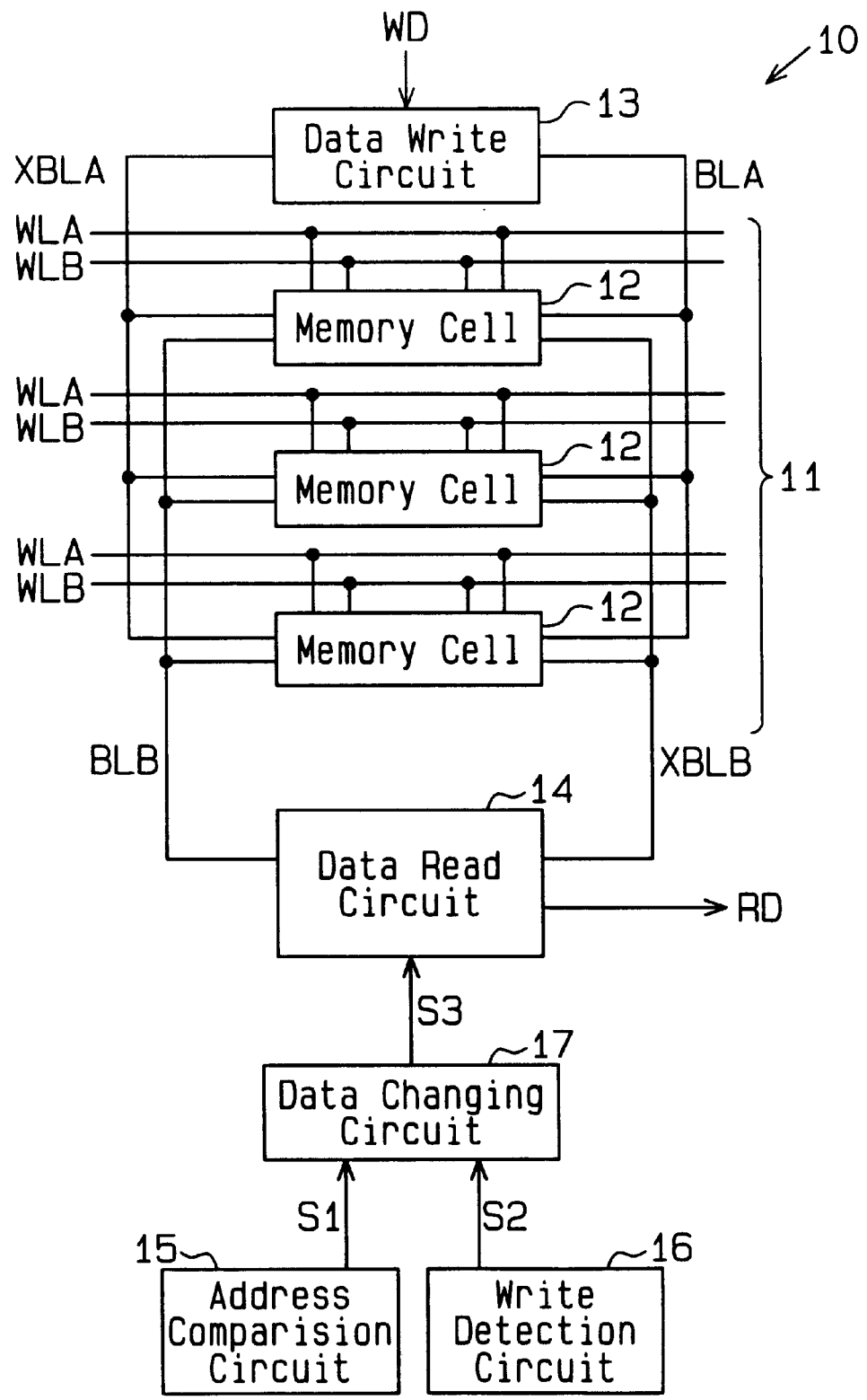
FIG. 1 is a schematic block diagram of a prior art semiconductor memory device.

In the drawings, like numerals are used for like elements throughout.

[First Embodiment]

Figure 2:
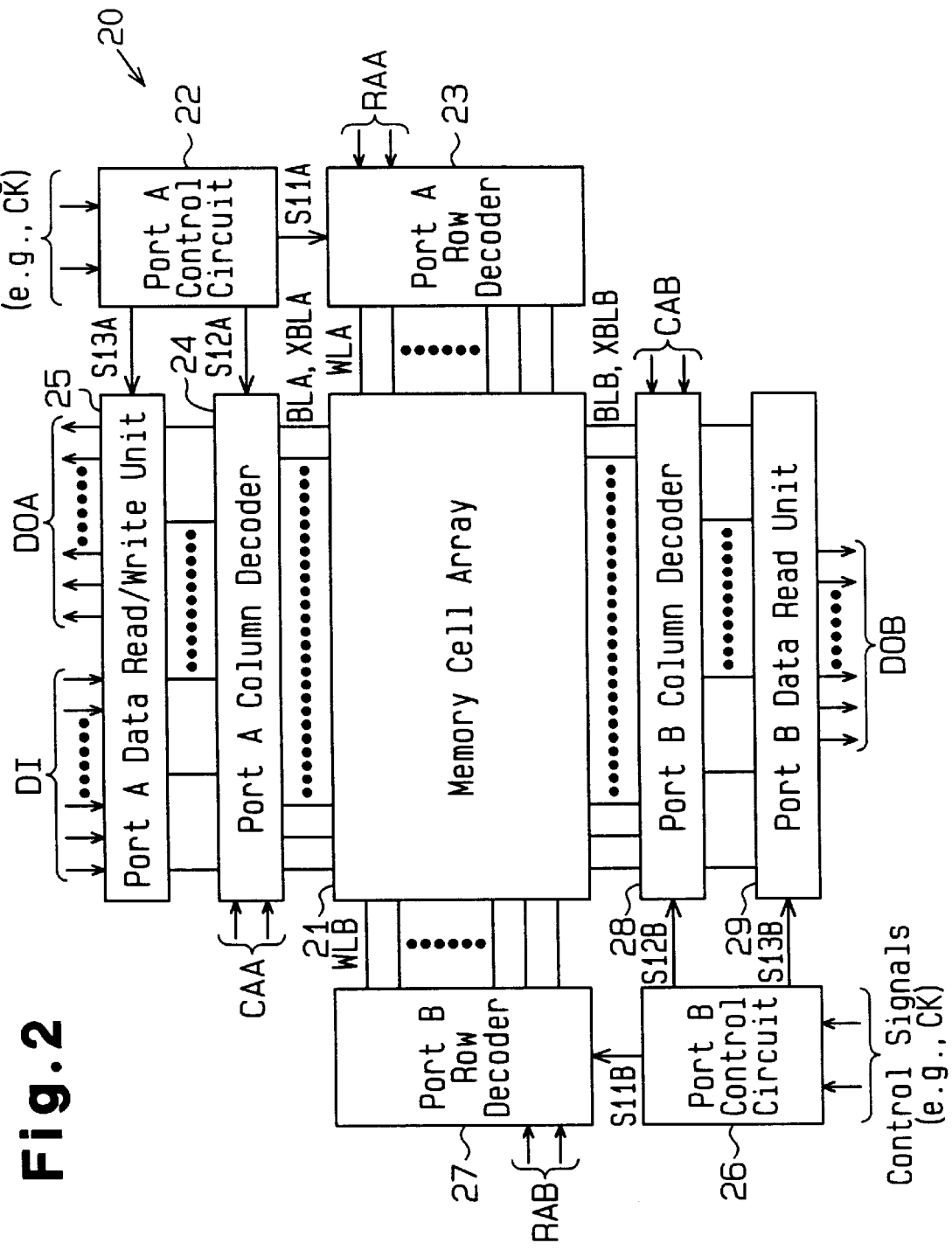
FIG. 2 is a schematic block diagram of a semiconductor memory device according to a first embodiment of the present invention.

FIG. 2 is a schematic block diagram of a semiconductor memory device 20 according to a first embodiment of the present invention. In the first embodiment, the semiconductor memory device 20 is applied to a dual port memory.

The dual port memory 20 includes a memory cell array 21 and two ports (ports A and B). Port A is an input/output port and functions to write data to the memory cell array 21 and read data from the memory cell array 21. Port B is an output port and functions to read data from the memory cell array 21.

The dual port memory 20 further includes a port A control circuit 22, a port A row decoder 23, a port A column decoder 24, and a port A data read/write unit 25. The dual port memory 20 also has a port B control circuit 26, a port B row decoder 27, a port B column decoder 28, and a port B data read unit 29.

The memory cell array 21 is connected to the port A row decoder 23 by a plurality of first word lines WLA and connected to the port A column decoder 24 by pairs of first bit lines BLA, XBLA. The memory cell array 21 is connected to the port B row decoder 27 by a plurality of second word lines WLB and connected to the port B column decoder 28 by pairs of second bit lines BLB, XBLB.

The port A control circuit 22 receives a plurality of control signals including a clock signal CK and generates control signals S11A, S12A, S13A based on the received control signals. Further, the port A control circuit 22 provides the control signal S11A to the port A row decoder 23, the control signal S12A to the port A column decoder 24, and the control signal S13A to the port A data read/write unit 25.

The port A row decoder 23 receives a port A row address signal RAA based on the control signal S11A and decodes the row address signal RAA. One of the first word lines WLA is activated based on the decoded row address signal RAA.

The port A column decoder 24 receives a port A column address signal CAA based on the control signal S12A and decodes the column address signal CAA. One of the pairs of first bit lines BLA, XBLA is connected to the data read/write unit 25 based on the decoded column address signal CAA.

The port A data read/write unit 25 performs reading and writing based on the control signal S13A. When writing data, the port A read/write unit 25 drives the pair of first bit lines BLA, XBLA connected by the port A column decoder 24 based on input data DI. In this state, the input data DI is stored in the memory cell connected to the intersection between the driven pair of first bit lines BLA, XBLA and the activated first word line WLA.

When reading data, the memory cells connected to the activated first word line WLA drive the first bit lines BLA, XBLA based on the stored data. The port A data read/write unit 25 amplifies the potential difference between the connected first bit lines BLA, XBLA so as to generate first output data DOA and output the first output data DOA to an external device.

The port B control circuit 26 receives a plurality of control signals including a clock signal CK and generates control signals S11B, S12B, S13B based on the received control signals. Further, the port B control circuit 26 provides the control signal S11B to the port B row decoder 27, the control signal S12B to the port B column decoder 28, and the control signal S13B to the port B data read unit 29.

The port B row decoder 27 receives a port B row address signal RAB based on the control signal S11B and decodes the row address signal RAB. One of the second word lines WLB is activated based on the decoded row address signal RAB. The memory cells connected to the activated second word line WLB drive the second bit lines BLB, XBLB based on the stored data.

The port B column decoder 28 receives a port B column address signal CAB based on the control signal S12B and decodes the column address signal CAB. One of the pairs of second bit lines BLB, XBLB is connected to the port B data read unit 29 based on the decoded column address signal CAB.

Based on the control signal S13B, the port B data read unit 29 amplifies the potential difference between the second bit lines BLB, XBLB connected by the port B column decoder 28, so as to generate second output data DOB and output the second output data DOB to an external device.

The dual port memory 20 is a synchronous semiconductor memory device (SRAM). The port A control circuit 22 generates the control signals S11A–S13A, which includes an internal clock signal CK. The port B control circuit 26 generates the control signals S11B–Sl3B, which also includes the clock signal CK. Thus, the circuits 23–25, which respectively receive the control signals S11A–S13A, and the circuits 27–29, which respectively receive the control signals S11B–S13B, are operated in synchronism with the clock signal CK.

Figure 3:
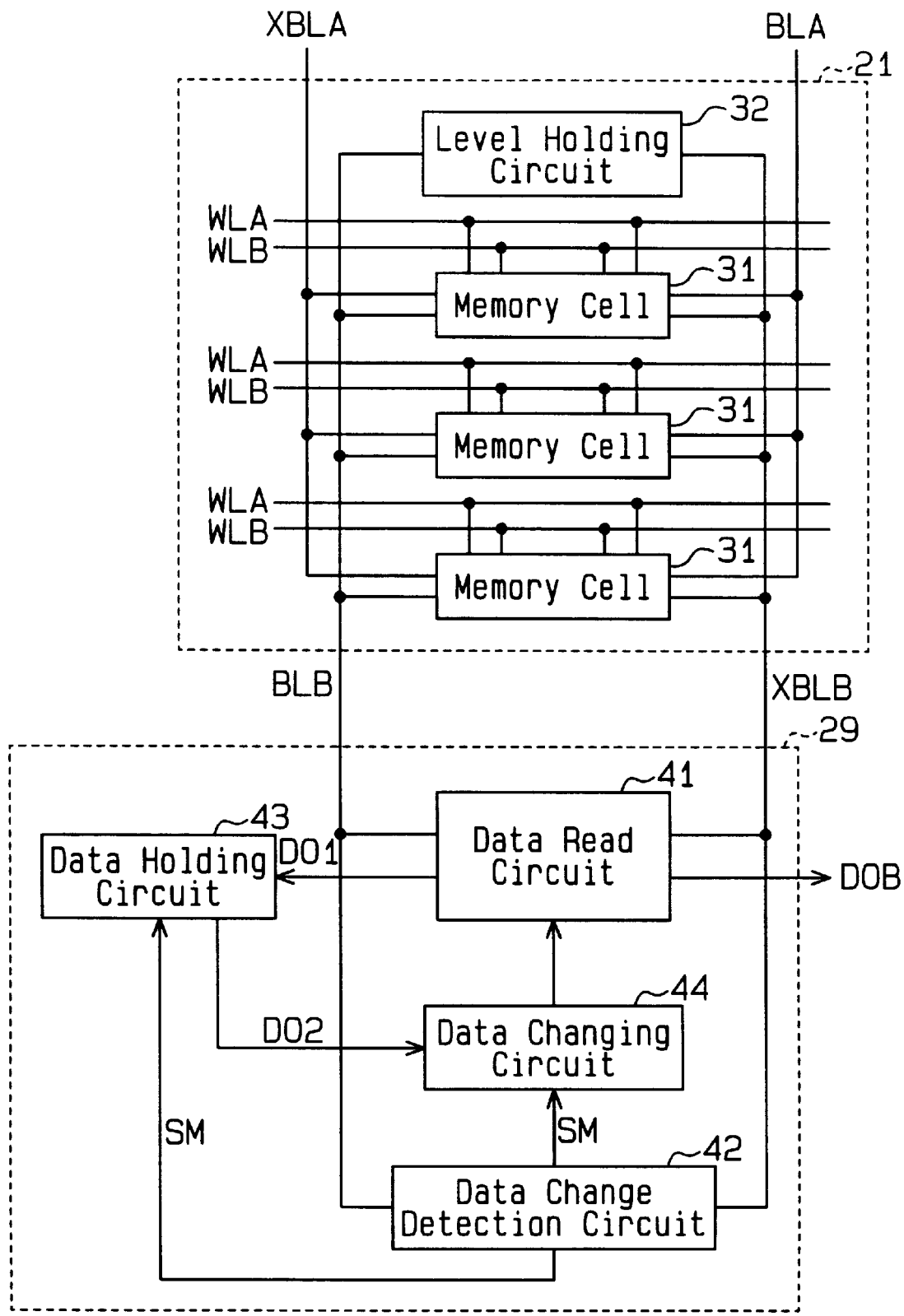
FIG. 3 is a schematic block diagram of the semiconductor memory device of FIG. 2.

FIG. 3 is a block diagram of the dual port memory 20 and shows portions related to data change at the port B.

The memory cell array 21 includes a plurality of memory cells 31 arranged in a matrix-like manner. The memory cells 31 arranged in the same column are each connected to the same pair of first bit lines BLA, XBLA and to the same pair of second bit lines BLB, XBLB. Further, the memory cells 31 arranged in the same row are each connected to the same first and second word lines WLA, WLB.

FIG. 3 shows three of the memory cells 31 connected to a pair of the first bit lines BLA, XBLA and a pair of the second bit lines BLB, XBLB. Each of the memory cells 31 in the first embodiment is a twin open-drain cell.

The second bit lines BLB, XBLB are connected to a level holding circuit 32. When the data in the memory cells 31 is changed, the level holding circuit 32 charges one of the second bit lines BLB, XBLB that is discharged by data reading. The potential level of the charged one of the second bit lines BLB, XBLB is inverted.

Figure 4:
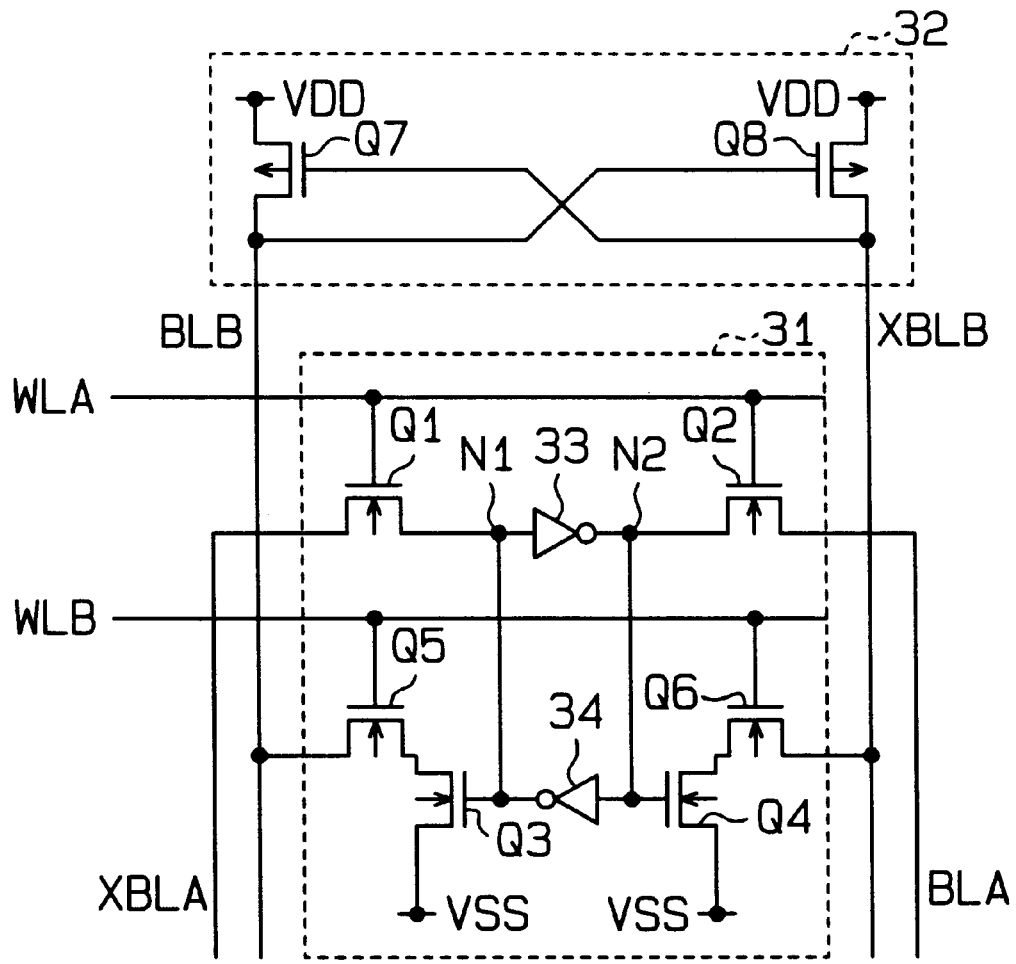
FIG. 4 is a schematic circuit diagram of a memory cell and a level holding circuit of the semiconductor memory device of FIG. 2.

With reference to FIG. 4, each memory cell 31 includes ten transistors. That is, each memory cell 31 includes two CMOS inverters 33, 34 (i.e., four MOS transistors) and six NMOS transistors Q1–Q6. The output terminal of the inverter 33 is connected to the input terminal of the inverter 34, and the output terminal of the inverter 34 is connected to the input terminal of the inverter 33.

The gate of the NMOS transistor Q1 is connected to the associated first word line WLA. Based on a signal received by the first word line WLA, the NMOS transistor Q1 connects a first node N1 to the associated invert first bit line XBLA. The first node N1 is located between the input terminal of the inverter 33 and the output terminal of the inverter 34.

The gate of the NMOS transistor Q2 is connected to the associated first word line WLA. Based on a signal received by the first word line WLA, the NMOS transistor Q2 connects a second node N2 to the associated first bit line BLA. The second node N2 is located between the output terminal of the inverter 33 and the input terminal of the inverter 34.

The gate of the NMOS transistor Q3 is connected to the first node N1, and the gate of the NMOS transistor Q4 is connected to the second node N2. The sources of the NMOS transistors Q3, Q4 are each connected to a low potential power supply VSS.

The gate of the NMOS transistor Q5 is connected to the associated second word line WLB. Based on a signal received by the second word line WLB, the NMOS transistor Q5 connects the drain of the NMOS transistor Q3 to the associated second bit line BLB. The gate of the NMOS transistor Q6 is connected to the second word line WLB. Based on the signal received by the second word line WLB, the NMOS transistor Q6 connects the drain of the NMOS transistor Q4 to the associated invert second bit line XBLB.

The level holding circuit 32 includes two PMOS transistors Q7, Q8. The PMOS transistor Q7 has a source connected to a high potential power supply VDD, a drain connected to the second bit line BLB, and a gate connected to the invert second bit line XBLB. The PMOS transistor Q8 has a source connected to a high potential power supply VDD, a drain connected to the invert second bit line XBLB, and a gate connected to the second bit line BLB.

The changing of memory data will now be discussed with referenced to FIG. 5. After reading data from a memory cell 31 to the port B, the dual port memory 20 writes data from the port A to change the memory data.

When the memory cell 31 holds data "0", the potential at the first node N1 is at low level and the potential at the second node N2 is at high level. Thus, the NMOS transistor Q3 is deactivated and the NMOS transistor Q4 is activated. The associated pair of second bit lines BLB, XBLB are precharged to a predetermined potential (which is at the high potential power supply VDD level, defined as the high level) by a precharge circuit (not shown).

When the associated second word line WLB is selected and the potential at the second word line WLB shifts to the high level, the NMOS transistors Q5, Q6 are activated. The activated NMOS transistors Q5, Q6 connect the invert second bit line XBLB to the low potential power supply VSS via the activated NMOS transistors Q6, Q4 and discharges the invert second bit line XBLB. In this state, the PMOS transistor Q7 of the level holding circuit 32 is activated, and the level holding circuit 32 holds the potential at the second bit line BLB at the high level.

When data "1" is written to the memory cell 31 from the port A, the port A data read/write unit 25 (shown in FIG. 2) provides the first bit line BLA with a low voltage and the invert first bit line XBLA with a high voltage. In this state, the associated first word line WLA is selected. When the potential of the first word line WLA shifts to the high level, the NMOS transistors Q1, Q2 are activated. Thus, the potential at the first node N1 shifts to the high level, and the potential at the second node N2 shifts to the low level. Accordingly, the NMOS transistor Q3 is activated and the NMOS transistor Q4 is deactivated.

In this state, the second word line WLB activates the NMOS transistor Q5. Thus, the second bit line BLB is discharged. Accordingly, the PMOS transistor Q8 of the level holding circuit 32 is activated. This charges the invert second bit line XBLB and shifts the potential of the invert second bit line XBLB to the high level. The same operation is performed when the memory cell 31 holds data "1", which is changed to data "0" written from the port A.

In this manner, when the data is read from a memory cell 31, the level holding circuit 32 holds the associated second bit line BLB (or the invert second bit line XBLB) at a high level. When the data in the memory cell 31 changes, the level holding circuit 32 charges the associated invert second bit line XBLB (or the second bit line BLB), which has been discharged during data reading.

The port B data read unit 29 of FIG. 2 will now be discussed.

The port B data read unit 29 includes a data read circuit 41, a data change detection circuit 42, a data holding circuit 43, and a data changing circuit 44, as shown in FIG. 3. The data read circuit 41 and the data change detection circuit 42 are connected to the pairs of second bit lines BLB, XBLB.

The data read circuit 41 amplifies the potential difference produced between the pairs of second bit lines BLB, XBLB to generate an amplified signal. Then, the data read circuit 41 latches the amplified signal to generate second output data DOB and first holding data DO1, and provides the first holding data DO1 to the data holding circuit 43.

The data change detection circuit 42 detects whether the data in the memory cells 31 has been changed and generates a detection signal SM. The detection signal SM is provided to the data holding circuit 43 and the data changing circuit 44.

Figure 5:
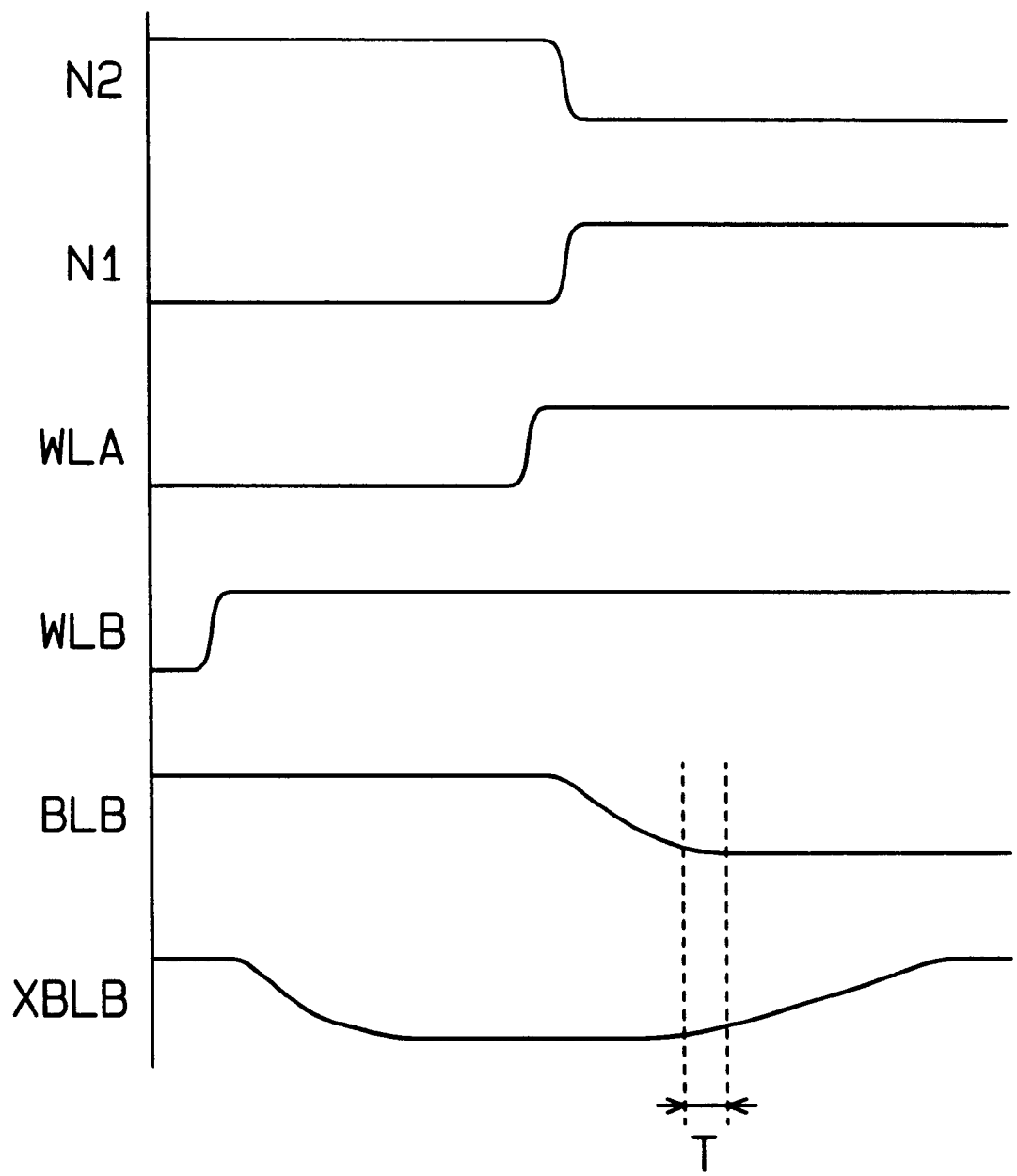
FIG. 5 is a combined timing and waveform chart illustrating read and write operations in the semiconductor memory device of FIG. 2.

Referring to FIG. 5, in the first embodiment when the data in a memory cell 31 is changed, the potentials at the associated second bit lines BLB, XBLB are both low during a time period T. The data change detection circuit 42 (see FIG. 3) detects whether the potentials at the second bit lines BLB, XBLB are both low. If the potentials at the second bit lines BLB, XBLB are both low, the data change detection circuit 42 generates the detection signal SM at a high level. If one of the potentials at the second bit lines BLB, XBLB is high, the data change detection circuit 42 generates the detection signal SM at a low level.

The data holding circuit 43 holds the data read from a memory cell 31. The data holding circuit 43 receives the first holding data DO1, generates second holding data DO2, and provides the second holding data DO2 to the data changing circuit 44. When the detection signal SM is high, the data changing circuit 44 changes the data held by the data read circuit 41 based on the second holding data DO2.

In this manner, in the port B data read unit 29 the data change detection circuit 42 detects the change of data in the memory cells 31 and changes the second output data DOB based on the detection signal SM.

Figure 6:
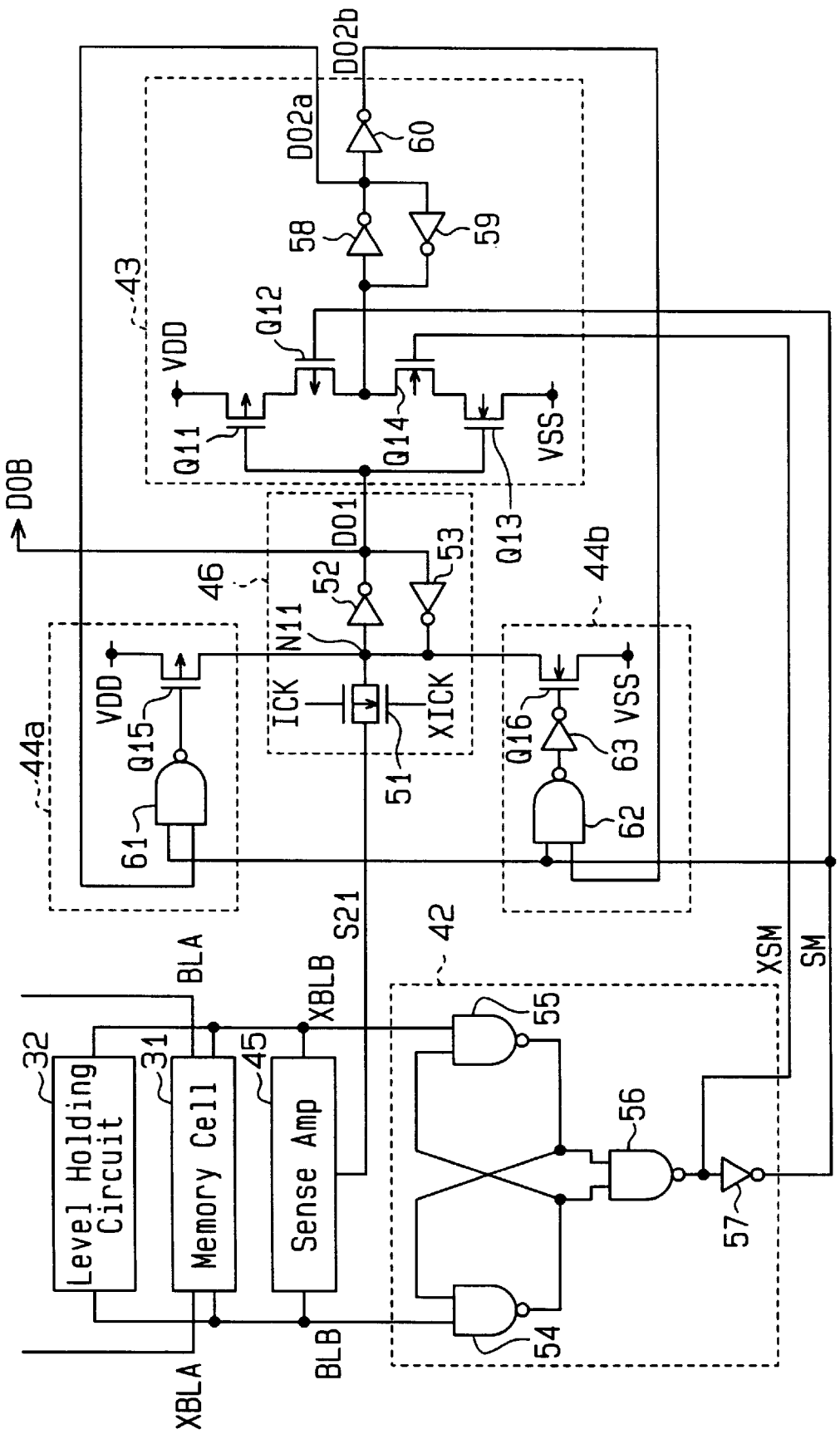
FIG. 6 is a schematic circuit diagram of a read circuit of the semiconductor memory device of FIG. 2.

The port B data read unit 29 will now be discussed with reference to FIG. 6.

The data read circuit 41 includes a sense amplifier 45 and a latch circuit 46. The sense amplifier 45 amplifies the potential difference between the second bit lines BLB, XBLB and generates an amplified signal S21. The amplified signal S21 is provided to the latch circuit 46. For example, if the potential at the second bit line BLB is high and the potential at the invert second bit line XBLB is low, the amplified signal S21 provided to the latch circuit 46 is high.

The latch circuit 46 has a transfer gate 51 and two inverters 52, 53. The transfer gate 51 includes a PMOS transistor and an NMOS transistor. The gate of the PMOS transistor receives an internal clock signal ICK, and the gate of the NMOS transistor receives an inverted internal clock signal XICK. The internal clock signal ICK and the inverted clock signal XICK are included in the control signal S13B and generated from the clock signal CK (see FIG. 2). The transfer gate 51 is activated and deactivated based on the internal clock signals ICK, XICK. When the transfer gate 51 is activated, the sense amplifier 45 is connected to the input terminal of the inverter 52. Further, the output terminal of the inverter 52 is connected to the input terminal of the inverter 53, and the output terminal of the inverter 53 is connected to the input terminal of the inverter 52.

In a synchronous semiconductor device, the clock signals that activate and deactivate the transfer gate 51 are the internal clock signals ICK, XICK. In an asynchronous semiconductor memory device, the clock signals that activate and deactivate the transfer gate 51 are control signals based on shifted addresses.

The latch circuit 46 receives the amplified signal S21 from the sense amplifier 45 based on the internal clock signals ICK, XICK. The latch circuit 46 latches the received amplified signal S21 to generate the first holding data DO1 and the second output data DOB. The first holding data DO1 is provided to the data holding circuit 43, and the second output data DOB is output to an external device. The first holding data DO1 and the second output data DOB are the same signal.

The data change detection circuit 42 includes three NAND circuits 54, 55, 56 and an inverter 57. The NAND circuits 54, 55 constitute a latch circuit.

The second bit line BLB is connected to a first input terminal of the NAND circuit 54, and the output terminal of the NAND circuit 55 is connected to a second input terminal of the NAND circuit 54. The invert second bit line XBLB is connected to a first input terminal of the NAND circuit 55, and the output terminal of the NAND circuit 54 is connected to a second input terminal of the NAND circuit 55.

The output terminal of the NAND circuit 54 is connected to a first input terminal of the NAND circuit 56, and the output terminal of the NAND circuit 55 is connected to a second input terminal of the NAND circuit 56. The output terminal of the NAND circuit 56 is connected to the input terminal of the inverter 57. The inverter 57 inverts the output signal of the NAND circuit 56 to generate the detection signal SM and provides the detection signal SM to the data holding circuit 43 and the data changing circuit 44 (including first and second changing circuits 44a, 44b). The inverted detection signal XSM is provided from a node between the NAND circuit 56 and the inverter 57 to the data holding circuit 43.

In the data change detection circuit 42, when the potential at one of the second bit lines BLB, XBLB is high, the inverted detection signal XSM output from the NAND circuit 56 is high, and the detection signal SM output from the inverter 57 is low. If the potentials at the second bit lines BLB, XBLB are both low, the inverted detection signal XSM output from the NAND circuit 56 is low, and the detection signal SM output from the inverter 57 is high.

The data holding circuit 43 includes two PMOS transistors Q11, Q12, two NMOS transistors Q13, Q14, and three inverters 58, 59, 60. The transistors Q11–Q14 constitute an inverter circuit, which is operated based on the detection signals SM, XSM. The inverters 58, 59 constitute a latch circuit.

The gates of the PMOS transistor Q11 and the NMOS transistor Q13 receive the first holding data DO1. The source of the PMOS transistor Q11 is connected to the high potential power supply VDD, and the source of the NMOS transistor Q13 is connected to the low potential power supply VSS.

The PMOS transistor Q12 and the NMOS transistor Q14 are connected between the drains of the transistors Q11, Q13. The gate of the PMOS transistor Q12 receives the detection signal SM, and the gate of the NMOS transistor Q14 receives the inverted detection signal XSM. A node between the PMOS transistor Q12 and the NMOS transistor Q14 is connected to the input terminal of the inverter 58.

The output terminal of the inverter 58 is connected to the input terminals of the inverters 59, 60, and the output terminal of the inverter 59 is connected to the input terminal of the inverter 58. The inverter 58 outputs the second holding data DO2$a$, and the inverter 60 outputs the inverted second holding data DO2$b$.

The data holding circuit 43 inverts the first holding data DO1 and generates the inverted first holding data DO1 with the inverter circuit (Q11–Q14), and provides the inverted first holding data DO1 to the latch circuit (58, 59). The data holding circuit 43 holds the inverted first holding data DO1 at the latch circuit (58, 59) and, based on the held data, outputs the second holding data DO2$a$ and the inverted second holding data DO2$b$.

The data changing circuit 44 has a first changing circuit 44$a$ and a second changing circuit 44$b$. The first changing circuit 44$a$ includes a NAND circuit 61 and a PMOS transistor Q15. The NAND circuit 61 has a first input terminal for receiving the detection signal SM and a second input terminal for receiving the second holding data DO2$a$.

The output terminal of the NAND circuit 61 is connected to the gate of the PMOS transistor Q15. The PMOS transistor Q15 has a source connected to the high potential power supply VDD and a drain connected to node N11 of the latch circuit 46.

When the detection signal SM and the second holding data DO2$a$ are both high, the NAND circuit 61 provides a low output signal to the gate of the PMOS transistor Q15. This activates the PMOS transistor Q15 and connects the node N11 to the high potential power supply VDD.

When the potential at the node N11 is low, the second output data DOB and the second holding data DO2$a$ are high. Based on the high detection signal SM and the high second holding data DO2$a$, the first changing circuit 44$a$ shifts the potential at the node N11 to a high level. Accordingly, the second output data DOB is changed to the low level.

The second changing circuit 44$b$ includes a NAND circuit 62, an inverter 63, and an NMOS transistor Q16. The NAND circuit 62 has a first input terminal for receiving the detection signal SM and a second input terminal for receiving the inverted second holding data DO2$b$. The output terminal of the NAND circuit 62 is connected to the input terminal of the inverter 63.

The output terminal of the inverter 63 is connected to the gate of the NMOS transistor Q16. The NMOS transistor Q16 has a source connected to the low potential power supply VSS and a drain connected to the node N11.

When the detection signal SM and the inverted second holding data DO2$b$ are both high, the NAND circuit 62 provides a low signal to the inverter 63. Then, the inverter 63 provides a high output signal to the gate of the NMOS transistor Q16. This activates the NMOS transistor Q16 and connects the node N11 to the low potential power supply VSS.

When the potential at the node N11 is high, the inverted second holding data DO2$b$ is high and the second output data DOB is low. The second changing circuit 44$b$ shifts the potential at the node N11 to a low level based on the high detection signal SM and the high inverted second holding data DO2$b$. In this state, the second output data DOB is changed to the high level.

Accordingly, in the dual port memory 20 (see FIG. 2), the data read circuit 41 is connected to the second bit lines BLB, XBLB and outputs the second output data DOB based on the potential level at the second bit lines BLB, XBLB.

When the potential levels at the second bit lines BLB, XBLB are both low, the data change detection circuit 42 detects whether data in the memory cell 31 has been changed. The memory cell 31 is one of the memory cells 31 from which data has been read prior to the data change. In this state, the data change detection circuit 42 generates a high detection signal SM and a low inverted detection signal XSM.

Based on the data read from the memory cell 31 prior to the data change, the data holding circuit 43 generates the second holding data DO2$a$ and inverted second holding data DO2$b$. Based on the high detection signal SM and the second holding data DO2$a$ (or the inverted second holding data DO2$b$), the data changing circuit 44 changes the output data DOB of the data read circuit 41 (latch circuit 46).

The semiconductor memory device (dual port memory) 20 according to the first embodiment has the advantages described as follows.

(1) When the potential levels at the second bit lines BLB, XBLB are both low, the port B data read unit 29 detects whether the data in the memory cell 31 has been changed, and changes the output data DOB. The circuit scales of the data change detection circuit 42, the data holding circuit 43, and the data changing circuit 44 in the port B data read unit 29 are significantly smaller than the circuit scales of the prior art address comparison circuit 15, the write detection circuit 16, and the data changing circuit 17 (see FIG. 1). Thus, even if the number of ports is increased, the scale of the circuit for changing data is small. This enhances the integration capability of the dual port memory 20.

[Second Embodiment]

Figure 7:
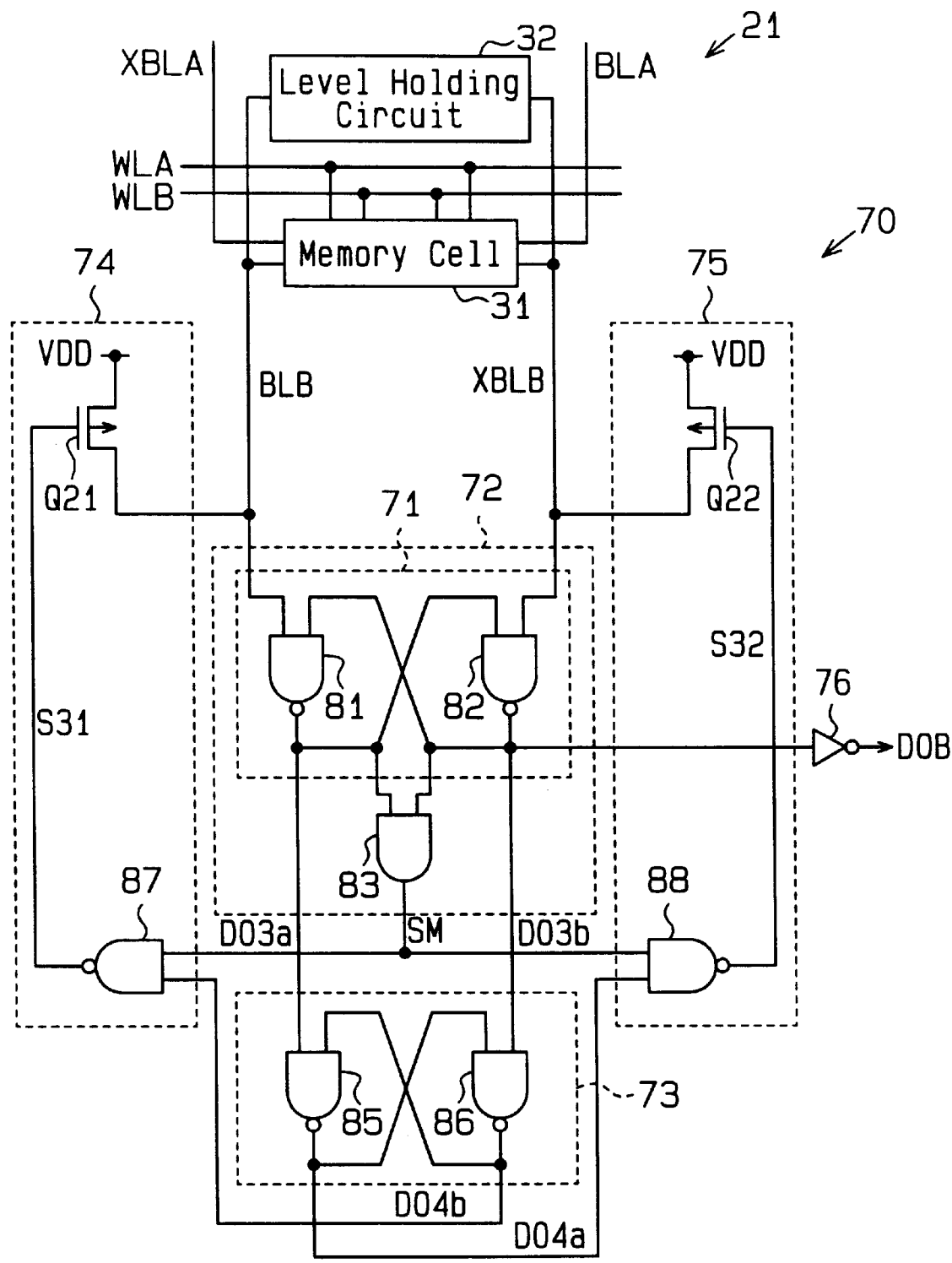
FIG. 7 is a schematic circuit diagram of a semiconductor memory device according to a second embodiment of the present invention.

FIG. 7 is a schematic circuit diagram of a semiconductor memory device according to a second embodiment the present invention. In the second embodiment, the semiconductor memory device is applied to a dual port memory. FIG. 7 illustrates a port B data read unit 70 of the dual port memory.

The port B data read unit 70 includes a data read circuit 71, a data change detection circuit 72, a data holding circuit 73, a first changing circuit 74, a second changing circuit 75, and an inverter 76.

The data read circuit 71 is a latch circuit including two NAND circuits 81, 82. The NAND circuit 81 has a first input terminal connected to the second bit line BLB and a second input terminal connected to the output terminal of the NAND circuit 82. The NAND circuit 82 has a first input terminal connected to the invert second bit line XBLB and a second input terminal connected to the output terminal of the NAND circuit 81.

The data read circuit 71 latches the potential level at the second bit lines BLB, XBLB. The NAND circuit 81 outputs holding data DO3*a*, and the NAND circuit 82 outputs holding data DO3*b*. The output terminal of the NAND circuit 82 is connected to the input terminal of the inverter 76, and the inverter 76 outputs the second output data DOB.

The data change detection circuit 72 includes the data read circuit 71 and an AND circuit 83, wherein the AND circuit 83 is connected to the NAND circuits 81, 82 in the data read circuit 71. The AND circuit 83 generates the detection signal SM based on the holding data DO3*a*, DO3*b*.

When the potentials at the second bit lines BLB, XBLB are both low, the data change detection circuit 72 generates the detection signal SM at a high level. Otherwise, the data change detection circuit 72 generates the detection signal SM at a low level.

The data holding circuit 73 is a latch circuit that includes two NAND circuits 85, 86. The NAND circuit 85 has a first input terminal for receiving the holding data DO3*a* and a second input terminal connected to the output terminal of the NAND circuit 86. The NAND circuit 86 has a first input terminal for receiving the holding data DO3*b* and a second input terminal connected to the output terminal of the NAND circuit 85.

The data holding circuit 73 latches data corresponding to the level of the holding data DO3*a* and generates holding data DO4*a*, which is provided to the second changing circuit 75. The data holding circuit 73 also latches data corresponding to the level of the holding data DO3*b* and generates holding data DO4*b*, which is provided to the first changing circuit 74.

The first changing circuit 74 includes a NAND circuit 87 and a PMOS transistor Q21. The NAND circuit 87 has a first input terminal for receiving the detection signal SM and a second input terminal for receiving the holding data DO4*b*. The output terminal of the NAND circuit 87 is connected to the gate of the PMOS transistor Q21. The PMOS transistor Q21 has a source connected to the high potential power supply VDD and a drain connected to the second bit line BLB.

When the detection signal SM and the holding data DO4*b* are both high, the NAND circuit 87 provides the gate of the PMOS transistor Q21 with an output signal S31 at a low level. This activates the PMOS transistor Q21 and connects the second bit line BLB to the high potential power supply VDD. Based on the high detection signal SM and the high holding data DO4*b*, the first changing circuit 74 charges the second bit line BLB and shifts the potential at the second bit line BLB to a high level.

The second changing circuit 75 includes a NAND circuit 88 and a PMOS transistor Q22. The NAND circuit 88 has a first input terminal for receiving the detection signal SM and a second input terminal for receiving the holding data DO4*a*. The output terminal of the NAND circuit 88 is connected to the gate of the PMOS transistor Q22. The PMOS transistor Q22 has a source connected to the high potential power supply VDD and a drain connected to the invert second bit line XBLB.

When the detection signal SM and the holding data DO4*a* are both high, the NAND circuit 88 provides the gate of the PMOS transistor Q22 with a signal S32 at a low level. In this state, the PMOS transistor Q22 is activated and the invert second bit line XBLB is connected to the high potential power supply VDD. Based on the high detection signal SM and the high holding data DO4*a*, the second changing circuit 75 charges the invert second bit line XBLB and shifts the potential at the invert second bit line XBLB to a high level.

The operation of the port B data read unit 70 of the second embodiment will now be discussed with reference to FIG. 8.

A case in which the stored data in a memory cell 31 is changed to "1" after data "0" is read from the memory cell 31 will be described.

Prior to reading the data, the second bit lines BLB, XBLB are both precharged to a high level by a precharge circuit (not shown). Then, when the second word line WLB is activated, the memory cell 31 discharges the invert second bit line XBLB and shifts the potential at the invert second bit line XBLB to a low level. Based on the low invert second bit line XBLB, the level holding circuit 32 holds the second bit line BLB at a high level.

Based on the potentials at the second bit lines BLB, XBLB, the data read circuit 71 outputs the low holding data DO3*a* from the NAND circuit 81 and the high holding data DO3*b* from the NAND circuit 82. In this state, the inverter 76 outputs the low second output data DOB.

Subsequently, when the data in the memory cell 31 is changed to "1", the first word line WLA is activated, and the data "1" is written to the memory cell 31 from the port A via the first bit lines BLA, XBLA. The second bit line BLB is then discharged by the potentials at the first bit lines BLA, XBLA, and the potential at the second bit line BLB shifts to a low level.

The NAND circuit 81 receives the low potential at the second bit line BLB and outputs the high holding data DO3*a*. In this state, the AND circuit 83 generates a high detection signal SM. That is, when the potential levels at the second bit line BLB and the invert second bit line XBLB are both low, the data change detection circuit 72 detects that data in the memory cell 31 has been changed and generates the high detection signal SM.

The NAND circuit 85 of the data holding circuit 73 provides the NAND circuit 88 of the second changing circuit 75 with the high holding data DO4a based on the held data. In this state, the NAND circuit 88 of the second changing circuit 75 provides the low control signal S32 to the gate of the PMOS transistor Q22. Accordingly, the PMOS transistor Q22 is activated and the invert second bit line XBLB is connected to the high potential power supply VDD. The invert second bit line XBLB is charged and the potential at the invert second bit line XBLB is shifted to a high level.

The level holding circuit 32 charges the invert second bit line XBLB in accordance with the level shift (from the high level to the low level) of the second bit line BLB. The transistors Q7, Q8 (FIG. 4) of the level holding circuit 32 are used to hold the level (at a high level) of the invert second bit line XBLB, and the driving capacity of each of the transistors Q7, Q8 is low. Thus, as shown by the dotted line in FIG. 8, the potential at the second bit line XBLB increases gradually. Accordingly, it takes time for the potential at the invert second bit line XBLB to reach the high level.

In comparison, the activation of the PMOS transistor Q22 charges the invert second bit line XBLB in the second embodiment. The driving capacity of the PMOS transistor Q22 is greater than the driving capacities of the PMOS transistors Q7, Q8 in the level holding circuit 32.

Figure 8:
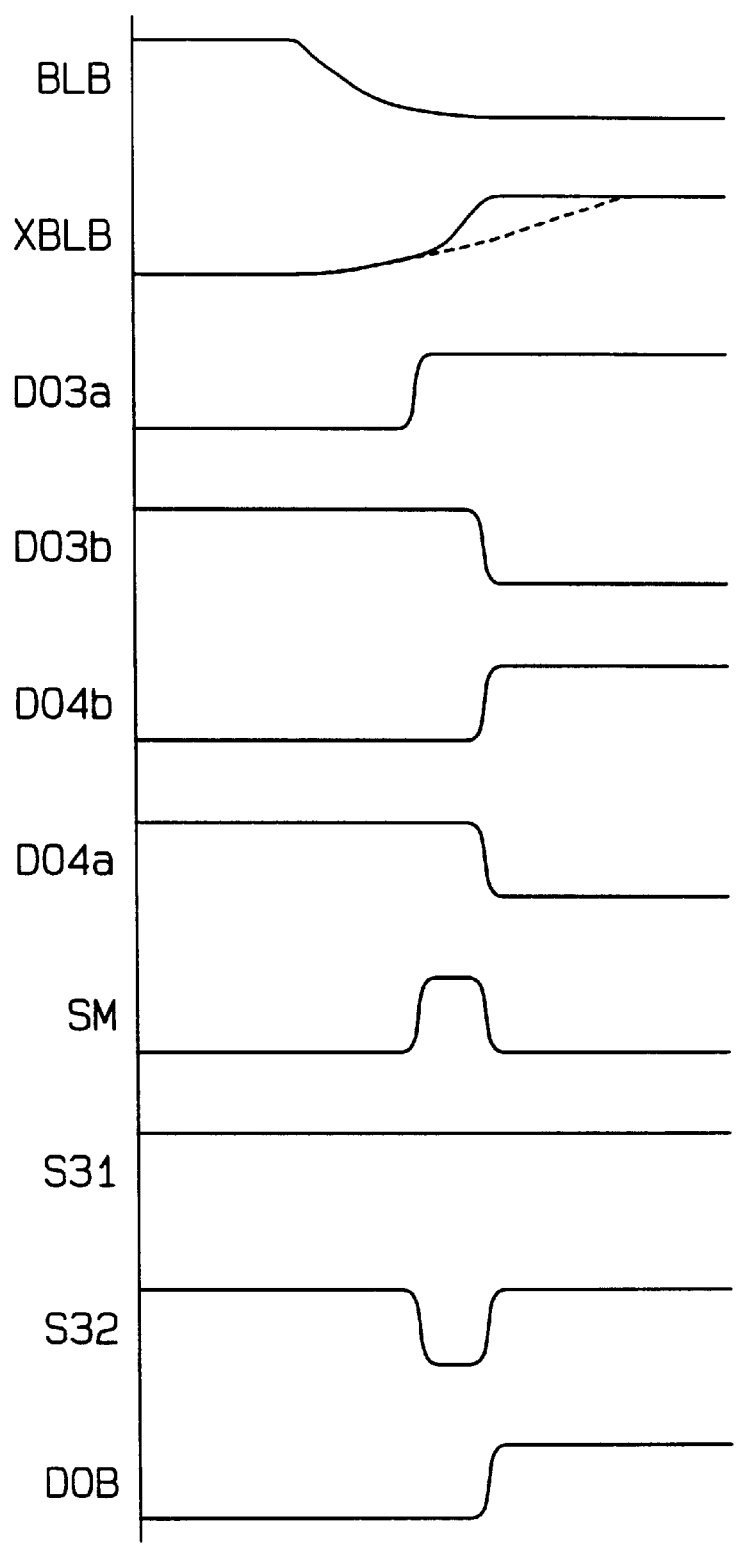
FIG. 8 is a combined timing and waveform chart illustrating the operation of the semiconductor memory device of FIG. 7.

Accordingly, referring to FIG. 8, the potential at the invert second bit line XBLB quickly reaches the high level. Based on changes in the potential at the invert second bit line XBLB, the NAND circuit 82 in the data read circuit 71 shifts the holding data DO3*b*. Thus, the port B data read unit 70 of the second embodiment shortens the time for changing the data held by the data read circuit 71.

When the potential at the invert second bit line XBLB shifts to the high level, the NAND circuit 82 provides the low second holding data DO3*b* to the inverter circuit 76. Accordingly, the inverter 76 outputs the high second output data DOB (change data).

Further, the AND circuit 83 in the data change detection circuit 72 provides the low detection signal SM to the NAND circuit 88 in the second changing circuit 75, and the NAND circuit 88 outputs the high signal S32. This deactivates the PMOS transistor Q22.

The data holding circuit 73 receives the high holding data DO3*a* and the low holding data DO3*b* and generates the low holding data DO4*a* and the high holding data DO4*b*.

The semiconductor memory device (dual memory) 21 of the second embodiment has the advantages described as follows.

(1) When the potential levels at the second bit lines BLB, XBLB are both low, the port B data read unit 70 detects that data has been changed in the memory cell 31 from which data has been read and changes the output data DOB. The circuit scale of the data change detection circuit 72, the data holding circuit 73, the first changing circuit 74, and the second changing circuit 75 in the port B data read unit 70 is significantly smaller than the address comparison circuit 15, the write detection circuit 16, and the data changing circuit 17 in the prior art. Thus, even if the number of ports increases, the scales of the circuits for changing data are small. This enhances the integration capability of the dual port memory.

(2) The first changing circuit 74 charges the second bit line BLB, and the second changing circuit 75 charges the invert second bit line XBLB. This accelerates the level shifting of the second bit lines BLB, XBLB and shortens the time from when data change in a memory cell 31 is detected to when the data in the data read circuit 71 is changed.

[Third Embodiment]

Figure 9:
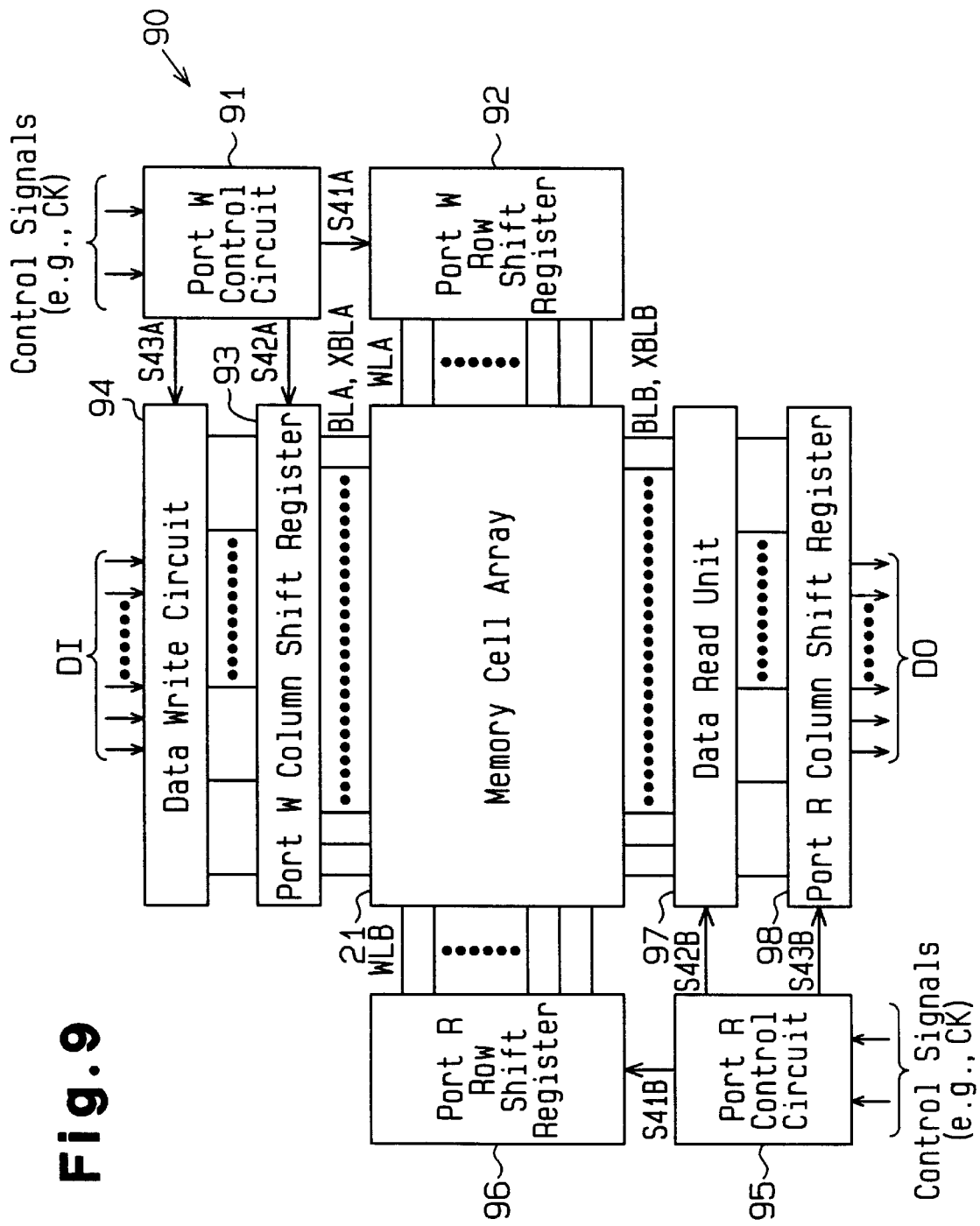
FIG. 9 is a schematic block diagram of a semiconductor memory device according to a third embodiment of the present invention.

FIG. 9 is a schematic block diagram of a semiconductor memory device 90 according to a third embodiment of the present invention. In the third embodiment, the semiconductor memory device 90 is applied to a delay line. The delay line is a semiconductor memory device used to process images and delay image data, for example, by storing image data of a single scan line.

The delay line 90 includes an input port W, which writes data to the memory cell array 21, and an output port R, which reads data.

Further, the delay line 90 includes a port W control circuit 91, a port W row shift register 92, a port W column shift register 93, a data write circuit 94, a port R control circuit 95, a port R row shift register 96, a data read unit 97, and a port R column shift register 98.

The memory cell array 21 is connected to the port W row shift register 92 by a plurality of first word lines WLA and to the port W column shift register 93 by a plurality of first bit lines BLA, XBLA. Further, the memory cell array 21 is connected to the port R row shift register 96 by a plurality of second word lines WLB and to the data read unit 97 by a plurality of second bit lines BLB, XBLB.

The port W control circuit 91 receives a plurality of control signals including a clock signal CK and generates control signals S41A, S42A, S43A based on the received control signals. The port W control circuit 91 provides the control signal S41A to the port W row shift register 92, the control signal S42A to the port W column shift register 93, and the control signal S43A to the data write circuit 94.

The port W row shift register 92 shifts the activated first word line WLA based on the control signal S41A. The port W column shift register 93 shifts the first bit lines BLA, XBLA connected to the data write circuit 94 based on the control signal S42A.

The data write circuit 94 writes data based on the control signal S43A. Further, the data write circuit 94 drives the first bit lines BLA, XBLA, which are connected to the port W column shift register 93, based on the input data DI. In this state, the input data DI is stored in the memory cell 31 (FIG. 3) that is connected to the intersection between the driven first bit lines BLA, XBLA and the activated first word line WLA.

The port R control circuit 95 receives a plurality of control signals including the clock signals CK and generates control signals S41B, S42B, S43B based on the received control signals. The port R control circuit 95 provides the control signal S41B to the port R row shift register 96, the control signal S42B to the data read unit 97, and the control signal S43B to the port R column shift register 98.

The port R row shift register 96 shifts the activated second word line WLB based on the control signal S41B. The memory cells 31 connected to the activated second word line WLB drives the pairs of the second bit lines BLB, XBLB connected to the second word line WLB in accordance with the stored data.

Based on the control signal S42B, the data read unit 97 holds data in accordance with the potential difference produced between the second bit lines BLB, XBLB. Based on the control signal S43B, the port R column shift register 98 shifts the data held in the data read unit 97 and outputs the output data DO to an external device.

Thus, data is synchronously read from the memory cells 31 that are connected to the activated second word line WLB, and sequentially output.

The data read unit 97 includes the data read unit 29 of the first embodiment or the data read unit 70 of the second embodiment. When the data read unit 97 includes the data read unit 29 of the first embodiment, the integration capability of the delay line 90 is enhanced. When the data read unit 97 includes the data read unit 70 of the second embodiment, the integration capability of the delay line 90 is enhanced and the data change time is shortened.

FIG. 10 is a combined timing and waveform chart illustrating the operation of the delay line 90. FIG. 10 illustrates waveforms taken when data is written to and read from four of the memory cells 31.

Address pointer ADP indicates the address of the memory cell 31 selected by the first word line WLA that is activated by the port W row shift register 92, and the pair of first bit lines BLA, XBLA selected by the port W column shift register 93. A further address pointer ADP indicates the address of the memory cell 31 selected by the second word line WLB that is activated by the port R row shift register 96, and the pair of second bit lines BLB, XBLB selected by the port R column shift register 98.

At port W, the address pointer ADP is incremented when the clock signal CK is provided to shift the address pointer ADP in a manner such as #0, #1, #2, #3, #0, and so on. This writes input data DI (e.g., 00, 1F, F1, FF, 1E, . . . ) respectively to the memory cells 31 indicated by the address pointer ADP.

At port R, the address pointer ADP is incremented when the clock signal CK is provided to shift the address pointer ADP in a manner such as #0, #1, #2, #3, #0, and so on. This outputs the stored data (e.g., 00, 1F, F1, FF, 1E, . . . ) respectively from the memory cells 31 indicated by the address pointer ADP.

The semiconductor memory device (delay line) 90 of the third embodiment has the advantages described as follows.

(1) The delay line 90 detects the data change in the memory cells 31 based on the potential levels at the second bit lines BLB, XBLB and changes the output data read from the memory cells 31. This enhances the integration capability of the delay line 90. Further, if the data read unit 97 includes the data read unit 70 of FIG. 7, the time required to change the output data is shortened.

It should be apparent to those skilled in the art that the present invention may be embodied in many other alternative forms without departing from the principle and the scope of the present invention. Particularly, it should be understood that the present invention may be embodied in the following forms.

The data change detection circuits 42, 72 may be altered as desired, so long as data change in the memory cells 31 can be detected based on the potential levels at the second bit lines BLB, XBLB that are reading the data. Further, the data change detection circuits 42, 72 may detect data change based on the potential level at one of the bit lines BLB, XBLB.

A semiconductor memory device according to the present invention may be applied to an asynchronous semiconductor memory device. In such a case, the transfer gate 51 in FIG. 6 receives a clock signal generated by an address shifting detection circuit (not shown).

The memory cell 31 may have plural sets of the transistors Q3–Q6 (FIG. 4) to read data.

The second bit lines BLB, XBLB may be precharged to a low level or an intermediate level (e.g., 1/2 VDD level).

A semiconductor memory device (a multiport memory or a delay line) according to the present invention may be applied to a semiconductor memory device incorporating other circuits (e.g., an image computing circuit in an image processor).

The present examples and embodiments are to be considered as illustrative and not restrictive, and the invention is not to be limited to the details given herein, but may be modified within the scope and equivalence of the appended claims.

What is claimed is:

1. A method for changing output data of a semiconductor memory device having a plurality of ports, wherein the semiconductor memory device includes a plurality of memory cells, a first bit line connected to the memory cells, a second bit line connected to the memory cells, a first port connected to the first bit line for writing input data to the memory cells via the first bit line, a second port connected to the second bit line for outputting data stored in the memory cells via the second bit line, and a data read circuit connected to the second bit line and including a latch circuit for holding the data of one of the memory cells, the method comprising the steps of:

detecting a change in the stored data in the memory cell based on a potential at the second bit line; and changing the data held by the latch circuit when a change in the stored data is detected.

2. The method according to claim 1, further comprising the step of:

accelerating shifting of the potential at the second bit line to change the data held by the latch circuit when a change in the stored data is detected.

3. The method according to claim 1, wherein the data read circuit includes at least a NAND circuit connected to the second bit line.

4. The method according to claim 3, further comprising the step of:

accelerating shifting of the potential at the second bit line to change the data held by the latch circuit when a change in the stored data is detected.

5. A semiconductor memory device comprising:

a plurality of memory cells;

a first word line connected to the memory cells;

a second word line connected to the memory cells;

a first bit line connected to the memory cells;

a second bit line connected to the memory cells;

a first port connected to the first word line and the first bit line for writing input data to the memory cells via the first bit line by activating the first word line; and a second port connected to the second word line and the second bit line for outputting data stored in each of the memory cells via the second bit line by activating the second word line, wherein the second port includes;

a data read circuit connected to the second bit line for receiving the stored data and generating output data from the stored data;

a data holding circuit connected to the data read circuit for holding the output data and generating holding data;

a data change detection circuit connected to the second bit line for detecting whether the stored data has been changed based on a potential at the second bit line; and a data changing circuit connected to the data change detection circuit and the data holding circuit for changing the output data using the holding data.

6. The semiconductor memory device according to claim 5, wherein the second bit line is one of a pair of bit lines connected to the memory cells, wherein the data change detection circuit generates a change signal for changing the output data when the potentials at the pair of bit lines are at a predetermined level, and wherein the data changing circuit changes the output data using the held data in response to the change signal.

7. The semiconductor memory device according to claim 6, wherein the data read circuit includes:

a sense amplifier connected to the pair of bit lines for amplifying a potential difference between the bit lines and generating amplified data; and a latch circuit connected to the sense amplifier for holding the amplified data to generate the output data, wherein the data changing circuit changes the output data held by the latch circuit.

8. The semiconductor memory device according to claim 7, wherein the data holding circuit generates complementary first and second holding data, and wherein the data changing circuit includes:

a first changing circuit connected to the data holding circuit for changing the output data to first changed data in response to the first holding data; and a second changing circuit connected to the data holding circuit for changing the output data to second changed data in response to the second holding data, wherein the second changed data is equivalent to an inverted version of the first changed data.

9. The semiconductor memory device according to claim 8, wherein the data read circuit includes:

a latch circuit having two inverters; and a transfer gate connected between the latch circuit and the sense amplifier, wherein the first and second changing circuits are connected to a node between the latch circuit and the transfer gate and change the output data by shifting a potential at the node.

10. The semiconductor memory device according to claim 9, wherein the data change detection circuit generates the change signal to change the output data when the potentials at the pair of bit lines are at a low level.

11. The semiconductor memory device according to claim 6, wherein the data read circuit includes a latch circuit having at least a NAND circuit.

12. The semiconductor memory device according to claim 11, wherein the holding circuit generates complementary first and second holding data, and wherein the data changing circuit includes:
- a first changing circuit connected to the data holding circuit for accelerating the shifting of the potential at one of the pair of bit lines in response to the first holding data and the change signal; and
- a second changing circuit connected to the data holding circuit for accelerating the shifting of the potential at the other one of the pair of bit lines in response to the second holding data and the change signal.

13. The semiconductor memory device according to claim 12, wherein the data change detection circuit generates the change signal to change the output data when the potentials at the pair of bit lines are at a low level.

14. The semiconductor memory device according to claim 11, wherein the data changing circuit accelerates shifting of the potential at the second bit line to change the data held by the latch circuit when a change in the stored data is detected.

15. A delay line comprising:

a plurality of memory cells;

a first word line connected to the memory cells;

a second word line connected to the memory cells;

a first bit line connected to the memory cells;

a second bit line connected to the memory cells;

a first port connected to the first word line and the first bit line for writing input data to the memory cells via the first bit line by activating the first word line; and a second port connected to the second word line and the second bit line for outputting data stored in each of the memory cells via the second bit line by activating the second word line, wherein the second port includes;
- a data read circuit connected to the second bit line for receiving the stored data and generating output data from the stored data;
- a data holding circuit connected to the data read circuit for holding the output data and generating holding data;
- a data change detection circuit connected to the second bit line for detecting whether the stored data has been changed based on a potential at the second bit line; and
- a data changing circuit connected to the data change detection circuit and the data holding circuit for changing the output data using the holding data.

16. A multiport memory comprising:

a plurality of memory cells;

a first word line connected to the memory cells;

a second word line connected to the memory cells;

a first bit line connected to the memory cells;

a second bit line connected to the memory cells;

a first port connected to the first word line and the first bit line for writing input data to the memory cells via the first bit line by activating the first word line; and a second port connected to the second word line and the second bit line for outputting data stored in each of the memory cells via the second bit line by activating the second word line, wherein the second port includes;
- a data read circuit connected to the second bit line for receiving the stored data and generating output data from the stored data;
- a data holding circuit connected to the data read circuit for holding the output data and generating holding data;
- a data change detection circuit connected to the second bit line for detecting whether the stored data has been changed based on a potential at the second bit line; and
- a data changing circuit connected to the data change detection circuit and the data holding circuit for changing the output data using the holding data.

* * * * *